(12) United States Patent
Rana et al.

(10) Patent No.: US 8,124,545 B2
(45) Date of Patent: Feb. 28, 2012

(54) METHODS OF ETCHING OXIDE, REDUCING ROUGHNESS, AND FORMING CAPACITOR CONSTRUCTIONS

(75) Inventors: Niraj B. Rana, Boise, ID (US); Kevin R. Shea, Boise, ID (US); Janos Fucsko, Boise, ID (US)

(73) Assignee: Micron Technology, Inc., Boise, ID (US)

(*) Notice: Subject to any disclaimer, the term of this patent is extended or adjusted under 35 U.S.C. 154(b) by 73 days.

(21) Appl. No.: 12/778,043

(22) Filed: May 11, 2010

(65) Prior Publication Data
US 2010/0221916 A1 Sep. 2, 2010

Related U.S. Application Data

(63) Continuation of application No. 11/127,944, filed on May 11, 2005, now Pat. No. 7,713,885.

(51) Int. Cl.
*H01L 21/31* (2006.01)

(52) U.S. Cl. ........ 438/781; 438/243; 438/244; 438/387; 438/702; 438/725; 438/756; 438/790; 438/963

(58) Field of Classification Search .................. 438/239, 438/243, 244, 386, 387, 700, 702, 703, 725, 438/756, 781, 790, 963, FOR. 220, FOR. 430
See application file for complete search history.

(56) References Cited

U.S. PATENT DOCUMENTS

| | | | |
|---|---|---|---|
| 3,717,560 A | 2/1973 | Breslow | |
| 3,835,130 A | 9/1974 | Woodward | |
| 3,917,698 A | 11/1975 | Breslow | |
| 4,165,295 A | 8/1979 | Vander Mey | |
| 4,215,005 A | 7/1980 | Vander Mey | |
| 4,595,519 A | 6/1986 | Takeno et al. | |
| 6,075,266 A | 6/2000 | Yoshitomi | |
| 6,103,627 A * | 8/2000 | Robinson et al. | 438/692 |
| 6,162,739 A * | 12/2000 | Sumnitsch et al. | 438/745 |
| 6,225,345 B1 | 5/2001 | Fassler et al. | |
| 6,492,075 B1 | 12/2002 | Templeton et al. | |
| 6,492,309 B1 | 12/2002 | Behr et al. | |
| 6,517,738 B1 | 2/2003 | Torek et al. | |
| 6,524,974 B1 * | 2/2003 | Sukharev | 438/787 |
| 6,562,735 B1 * | 5/2003 | Allman et al. | 438/790 |
| 6,783,695 B1 | 8/2004 | Torek et al. | |
| 7,112,506 B2 | 9/2006 | Kim et al. | |

(Continued)

FOREIGN PATENT DOCUMENTS

| | | |
|---|---|---|
| EP | 0782177 | 7/1997 |
| EP | 1536291 | 6/2005 |
| TW | 455513 | 9/2001 |
| WO | WO2004019134 | 3/2004 |

OTHER PUBLICATIONS

PCT/US2006/016680, PC, Sep. 4, 2006, PCT Written Opinion of the ISA. PCT/US2006/016680, PC, Sep. 4, 2006, PCT Search Report.

*Primary Examiner* — N Drew Richards
*Assistant Examiner* — Joannie A Garcia
(74) *Attorney, Agent, or Firm* — Wells St. John P.S.

(57) ABSTRACT

The invention includes methods in which one or more components of a carboxylic acid having an aqueous acidic dissociation constant of at least $1 \times 10^{-6}$ are utilized during the etch of oxide (such as silicon dioxide or doped silicon dioxide). Two or more carboxylic acids can be utilized. Exemplary carboxylic acids include trichloroacetic acid, maleic acid, and citric acid.

20 Claims, 3 Drawing Sheets

U.S. PATENT DOCUMENTS

| | | |
|---|---|---|
| 7,244,784 B2 | 7/2007 | Amick et al. |
| 2002/0068685 A1 | 6/2002 | Wojtczak et al. |
| 2002/0130388 A1 | 9/2002 | Stamper |
| 2003/0181342 A1 | 9/2003 | Seijo et al. |
| 2003/0235996 A1 | 12/2003 | Leon et al. |
| 2004/0171503 A1 | 9/2004 | Rovito et al. |
| 2006/0237392 A1 | 10/2006 | Auger et al. |

* cited by examiner

_Fig. 1_

_Fig. 2_

METHODS OF ETCHING OXIDE, REDUCING ROUGHNESS, AND FORMING CAPACITOR CONSTRUCTIONS

CROSS-REFERENCE TO RELATED APPLICATION

This application is a continuation of U.S. patent application Ser. No. 11/127,944, filed May 11, 2005, which is incorporated herein by reference.

TECHNICAL FIELD

The invention pertains to methods of etching oxide, and to methods of cleaning debris (such as solid-form etch by-products) from within openings. In particular aspects, the invention pertains to methods for reducing roughness induced on surfaces during cleaning of debris, and in some aspects the invention pertains to methods of forming capacitor constructions.

BACKGROUND OF THE INVENTION

It is common to etch through various oxides during semiconductor processing. Exemplary oxides include silicon dioxide, and doped silicon dioxide (such as, for example, borophosphosilicate glass (BPSG), and phosphosilicate glass (PSG)). Oxides are common in semiconductor processing due to their electrically insulative properties, and due to their ease of formation (for instance, oxides can be formed as spin-on-dielectric materials, or by numerous deposition methods, including, for example, chemical vapor deposition (CVD) methods).

It is common for oxides to be formed over electrically conductive nodes, and for openings to subsequently be etched through the oxides to the electrically conductive nodes to expose the nodes for subsequent processing. The openings are formed with etch chemistry which removes the oxide. In some aspects, the openings can be formed with multiple etch chemistries. For instance, a first etch chemistry can be utilized to create the openings, and a second etch chemistry can be utilized to clean debris that may have been formed by the first etch chemistry.

Problems can occur during formation of openings extending into oxides, in that one or more of the etch chemistries utilized during the formation of the openings can undesirably roughen the exposed oxide surfaces. For instance, substantially planar oxide surfaces may be exposed to the etch chemistry utilized to etch oxide-containing debris from within openings, and such surfaces may be undesirably roughened by such etch chemistry. Accordingly, it is desired to develop new methods for etching oxides.

SUMMARY OF THE INVENTION

In one aspect, the invention includes a method for etching an oxide. The oxide is exposed to a mixture which includes an alcohol, fluoride ions, and one or more components of a carboxylic acid having an acidic dissociation constant of at least $1 \times 10^{-6}$. For purposes of interpreting this disclosure and the claims that follow, the dissociation constants utilized herein are to be understood as being the dissociation constants which would be measured in water.

In one aspect, the invention includes a method for reducing roughness induced on a silicon-dioxide-containing surface during removal of silicon-dioxide-containing debris with a cleaning solution. The method includes incorporation within the cleaning solution of one or more components of a carboxylic acid having an acidic dissociation constant of at least $1 \times 10^{-6}$.

In one aspect, the invention includes a semiconductor processing method. A semiconductor substrate is provided. The substrate supports an oxide. At least one opening is etched to extend at least partially through the oxide. The etching leaves debris within the opening (the debris can be, for example, etch by-products). At least some of the debris is cleaned from within the opening. One or more components of a carboxylic acid having an acidic dissociation constant of at least $1 \times 10^{-6}$ are utilized during such cleaning.

In one aspect, the invention includes a method of forming a capacitor construction. A semiconductor construction is provided. The semiconductor construction includes a conductive node and an oxide over the node. The oxide consists essentially of silicon dioxide or doped silicon dioxide. An opening is etched through the oxide to expose the conductive node. The etching leaves debris within the opening (the debris can comprise etch by-products). At least some of the debris is cleaned from within the opening. A solution containing an alcohol, fluoride ions and a carboxylic acid having an acidic dissociation constant of at least $1 \times 10^{-6}$ is utilized during such cleaning. After the cleaning, a first capacitor electrode is formed within the opening. A capacitor dielectric is formed over the first capacitor electrode, and a second capacitor electrode is formed over the capacitor dielectric and capacitively coupled with the first capacitor electrode.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
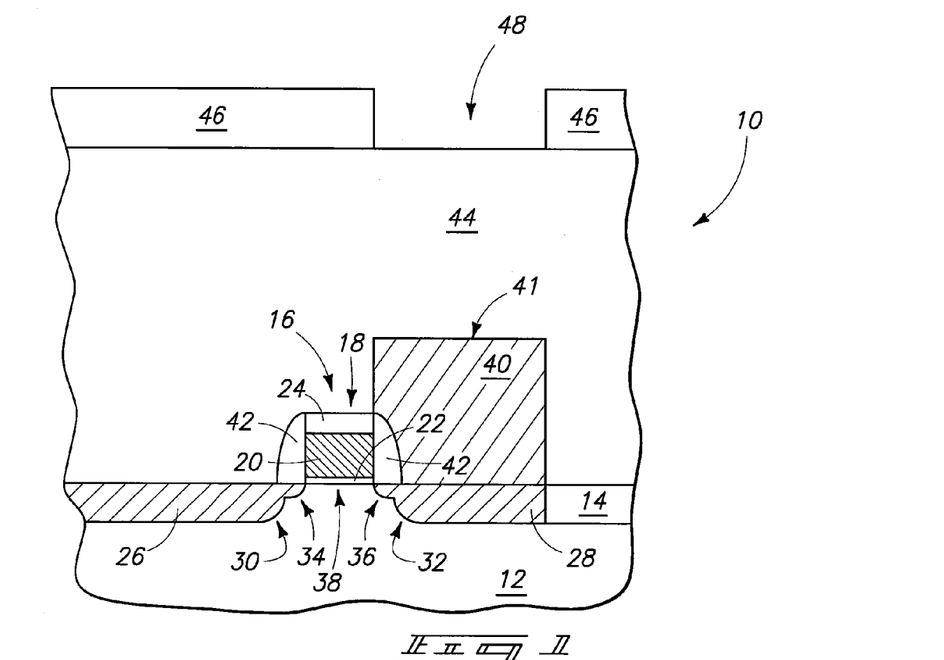
FIG. 1 is a diagrammatic, cross-sectional view of a semiconductor construction at a preliminary processing stage of an exemplary aspect of the present invention.

Exemplary aspects of the invention are described with reference to FIGS. 1-6. Referring initially to FIG. 1, a semiconductor construction 10 is illustrated at a preliminary processing stage. The construction 10 includes a semiconductor substrate 12. Substrate 12 can comprise, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An isolation region 14 is formed within substrate 12. Isolation region 14 can comprise, for example, a shallow trench isolation region. Accordingly, the isolation region 14 can comprise a trench formed within substrate 12 and then filled with suitable dielectric material, such as, for example, silicon dioxide.

A transistor device 16 is supported by substrate 12. The transistor device comprises a gate 18 containing conductive gate material 20 spaced from substrate 12 by gate dielectric 22. The gate dielectric 22 can comprise, consist essentially of, or consist of, silicon dioxide.

The conductive gate material 20 can comprise any suitable composition or combination of compositions, and can, for example, comprise metal, metal compounds and/or conductively-doped semiconductor material such as, for example, conductively-doped silicon.

The gate 18 also comprises a dielectric cap 24 formed over conductive material 20. Cap 24 can comprise, for example, silicon dioxide and/or silicon nitride.

The transistor device 16 comprises source/drain regions 26 and 28 on opposing sides of the gate 18. The shown source/drain regions are conductively-doped diffusion regions extending within substrate 12. Such diffusion regions can comprise p-type doped regions and/or n-type doped regions. The shown regions contain heavily-doped portions 30 and 32, and lightly-doped extensions 34 and 36 which extend between the heavily-doped portions and the edges of gate 18. A channel region 38 is beneath gate 18 and between the source/drain regions 26 and 28. In operation, the source/drain regions are electrically coupled to one another through the channel region when appropriate current passes through the gate.

A conductive pedestal 40 is formed over source/drain region 28 and electrically-coupled to such source/drain region. The conductive pedestal can comprise any suitable electrically conductive composition or combination of compositions. In some aspects, the pedestal will comprise conductively-doped silicon. The conductive pedestal has an uppermost surface 41 which can be referred to as an electrically conductive node in some aspects of the invention.

The exemplary processing described herein ultimately forms a capacitor construction coupled to diffusion region 28 through pedestal 41 to form a dynamic random access memory (DRAM) device comprising transistor 16 and the capacitor. The diffusion region 26 can be electrically coupled to a bitline so that the DRAM device can be incorporated into a DRAM array. Various methodologies for coupling diffusion region 26 to a bitline will be recognized by persons of ordinary skilled in the art, and such methodologies are not discussed in detail in this disclosure. Accordingly, various conductive materials that can be formed over diffusion region 26 for ultimately coupling the diffusion region to the bitline are not described or shown. It is to be understood, however, that a conductive pedestal similar to the pedestal 40 can be formed over diffusion region 26 in some aspects of the invention. It is also to be understood that numerous methods are known for coupling a capacitor to a diffusion region, and that some of the methods eliminate the conductive pedestal 40 and instead couple a storage node of the capacitor directly to the diffusion region. Thus, although the invention is described utilizing the conductive pedestal 40 between a capacitor (described below) and the diffusion region 28, it is to be understood that the invention also encompasses aspects (not shown) in which the conductive pedestal 40 is omitted and the capacitor is instead directly coupled to the diffusion region.

Sidewall spacers 42 are shown formed along sidewalls of gate 18. The sidewall spacers can comprise any suitable electrically insulative composition or combination of compositions, and typically will comprise one or both of silicon nitride and silicon dioxide. The conductive pedestal 40 is electrically isolated from conductive gate material 20 by one of the sidewall spacers.

An electrically insulative material 44 is provided over substrate 12, over transistor construction 16, and over conductive pedestal 40. Material 44 can comprise any suitable composition or combination of compositions. In particular aspects, material 44 will comprise, consist essentially of, or consist of silicon dioxide and/or doped silicon dioxide. For instance, material 44 can comprise BPSG, PSG, and/or silicon dioxide formed from tetra-ethyl-ortho-silicate (TEOS). One or more compositions of material 44 can be formed by chemical vapor deposition, and/or as spin-on-dielectrics. It is to be understood that the insulative material 44 can, in some aspects, comprise a non-oxide insulative composition in addition to one or more oxide insulative compositions. For instance, insulative material 44 can comprise a layer of silicon nitride in addition to one or more layers of silicon-dioxide-containing compositions.

A patterned mask 46 is formed over insulative material 44. Mask 46 can comprise, for example, photolithographically patterned photoresist. Mask 46 has an opening 48 extending therethrough. The opening is directly over the conductive node corresponding to surface 41 of pedestal 40.

Figure 2:
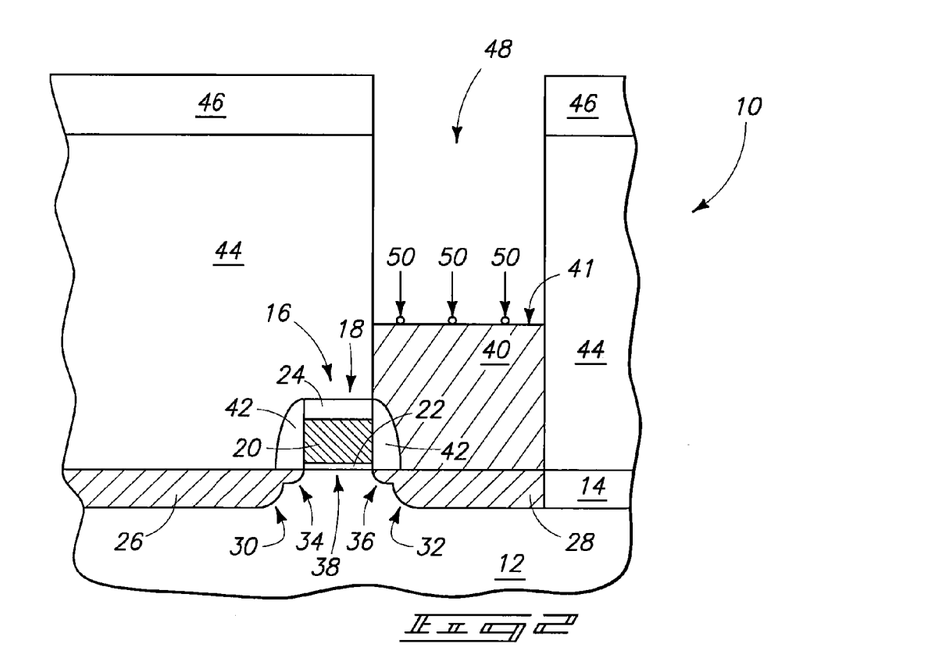
FIG. 2 is a view of the FIG. 1 construction shown at a processing stage subsequent to that of FIG. 1.

Referring next to FIG. 2, opening 48 is extended through insulative material 44 with a suitable etch to expose the conductive node corresponding to uppermost surface 41. The etch can be any suitable etch known in the art. For instance, if material 44 consists of one or more silicon-dioxide-containing compositions, the etch can utilize $CF_4/H_2$. The etch forms debris 50 within the opening 48.

Figure 3:
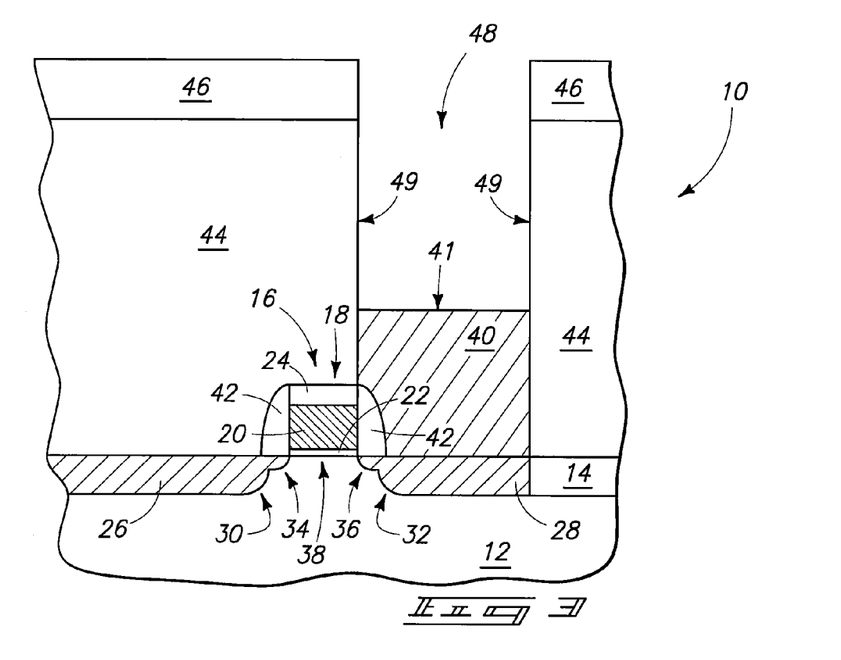
FIG. 3 is a view of the FIG. 1 construction shown at a processing stage subsequent to that of FIG. 2.

Referring next to FIG. 3, the debris 50 (FIG. 2) is removed with a suitable subsequent etch in a cleaning step. The debris can comprise, consist essentially of, or consist of oxide, and generally will comprise, consist essentially of, or consist of silicon dioxide and/or doped silicon dioxide. In an aspect of the present invention, such oxide-containing debris is removed with a mixture which includes at least one carboxylic acid having an acidic dissociation constant of at least $1\times10^{-6}$. The mixture includes one or more components of the carboxylic acid having an acidic dissociation constant of at least $1\times10^{-6}$, with such components being defined to be either the acid form of the carboxylic acid or a conjugate base form of the carboxylic acid. Typically, the total concentration of all of the components of a particular carboxylic acid within a cleaning mixture utilized in accordance with methodology of the present invention will be from about 1 part per million to a solubility limit of the components in the mixture.

Any carboxylic acids can be utilized, provided that the carboxylic acids have the acidic dissociation constant of at least $1\times10^{-6}$. For instance, the carboxylic acids can be mono-carboxylic acids, di-carboxylic acids, or carboxylic acids having three or more carboxylic acid groups. Ultimately, as discussed below, the carboxylic acids are utilized to reduce roughness on oxide-containing surfaces. It can be preferred to utilize carboxylic acids having more than one carboxylate group for such roughness-reduction, in that such carboxylic acids can, in some aspects, produce a greater roughness-reduction effect than is produced by mono-carboxylic acids.

Exemplary carboxylic acids that can be utilized in accordance with aspects of the present invention are trichloroacetic acid (which has an acidic dissociation constant in water of $1.99 \times 10^{-1}$); maleic acid (which has an acidic dissociation constant in water of $1.5 \times 10^{-2}$); and citric acid (which as an acidic dissociation constant in water of $6.6 \times 10^{-4}$).

In some aspects, a cleaning solution can include a alcohol, fluoride ions and water in addition to the one or more components of at least one carboxylic acid having an acidic dissociation constant of at least $1 \times 10^{-6}$. The alcohol can be an alkyl alcohol, and in exemplary aspects can comprise, consist essentially of, or consist of isopropyl alcohol. In some aspects, other organic solvents can be utilized in addition to, or alternatively to, the alcohol. Such other organic solvents can include, for example, ketones, ethers and esters.

Cations can be present in addition to the fluoride ions, and in exemplary aspects, the cations can consist essentially of, or consist of ammonium ions. It is to be understood that ammonium ions are exemplary cations, and that other suitable cations can be utilized either alternatively or additionally to ammonium cations.

An exemplary mixture for cleaning oxide-containing debris can be formed by mixing the following:
(1) isopropyl alcohol provided to be present in the final mixture to concentration of from about 90% to about 99.9%, by weight (and typically at least about 98%);
(2) hydrofluoric acid provided to be present in the final mixture to a concentration of from about 0.03% to about 0.3%, by weight;
(3) ammonium fluoride provided to be present to a concentration in the final mixture of from about 0.02% to about 0.3%, by weight;
(4) water; and
(5) one or more carboxylic acids having an acidic dissociation constant of at least $1 \times 10^{-6}$ provided to be present in the final mixture such that a total concentration of components of the one or more carboxylic acids is from about 1 part per million (ppm) to a solubility limit of the carboxylic acids in the mixture.

The cleaning mixture prepared as described above will typically be a solution rather than other types of mixtures, (with other types of mixtures including, for example, emulsions, and mixtures having undissolved components therein).

The cleaning mixture is utilized to etch oxide-containing debris from within the opening 48. Such etching can be conducted while maintaining the cleaning solution at a temperature of from about 0° C. to about 75° C., under a pressure of anywhere from 0.01 atmospheres to greater than 10 atmospheres, and with a treatment time of from 1 second to about 10 hours. A typical treatment time is from about 1 minute to about 20 minutes.

Figure 4:
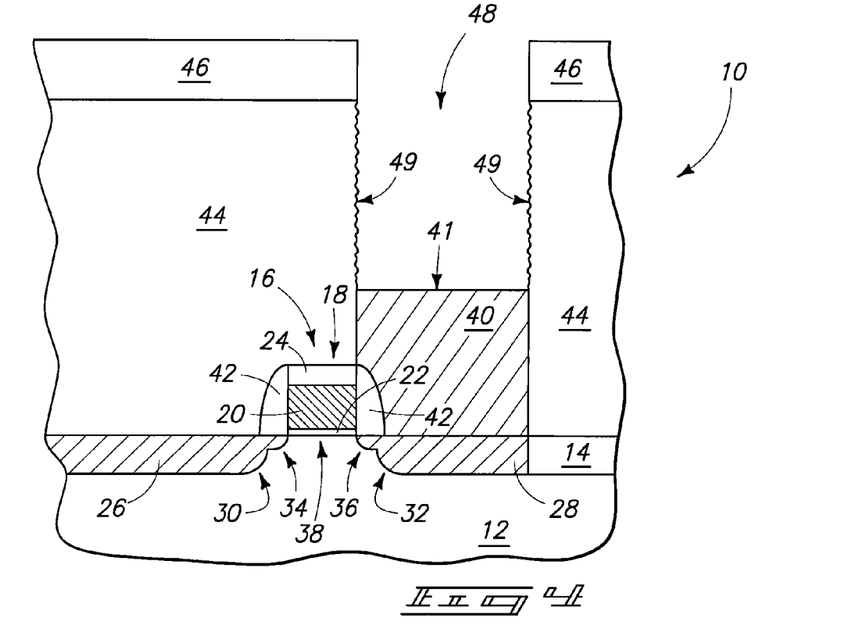
FIG. 4 is a view of the FIG. 1 construction shown at a processing stage subsequent to that of FIG. 2, and illustrates problems that can occur if processing alternative to that of FIG. 3 is utilized.

FIG. 3 shows construction 10 after cleaning has been conducted in accordance with aspects of the present invention to remove debris from within opening 48. The FIG. 3 construction shows opening 48 having sidewalls 49 which remain relatively smooth after the cleaning step. In contrast, FIG. 4 illustrates construction 10 at a processing stage identical to that of FIG. 3, but diagrammatically illustrating an effect which can occur if the carboxylic acid having an aqueous acidic dissociation constant of at least $1 \times 10^{-6}$ is left out of the cleaning solution. Specifically, the sidewalls 49 have roughened surfaces formed by the impact of the cleaning solution on such sidewall surfaces during the cleaning of the debris from within the opening. It is found that the amount of roughening can be reduced by at least two, four or even five fold by including the carboxylic acid with the aqueous acidic dissociation constant of $1 \times 10^{-6}$ in the cleaning solution. The amount of roughening was measured by atomic force microscopy as root mean square (RMS) roughness.

In light of the dramatic reduction in roughening occurring through incorporation of carboxylic acids having an acidic dissociation constant of $1 \times 10^{-6}$ in a cleaning solution during removal of silicon-dioxide-containing debris, such incorporation can be considered to be a method for reducing roughness induced on silicon-dioxide-containing surfaces during such cleaning. This can provide a significant advantage, in that the roughness induced during the cleaning can lead to numerous problems in controlling uniformity of opening dimensions. If uniformity is not adequately controlled, devices ultimately formed within the openings can operate outside of desired tolerances, and devices formed within adjacent openings can short to one another. Also, there can be poor interfaces formed between layers ultimately provided within opening 48 and the sidewalls of the opening if excessive roughening of the sidewalls occurs.

A possible mechanism by which the carboxylic acid can reduce the roughness occurring along the sidewalls of the opening is as follows. By-products may accumulate and aggregate during an etch, and such by-products may reduce an etch rate. The reduction in etch rate may increase the etch duration utilized to completely remove debris, and the increased etch duration may lead to increased roughening of exposed oxide surfaces. The by-products may accumulate because there is insufficient material within the cleaning solution to bind or dissolve the by-products, (for example, due to the coefficient of solubility of the by-products). The addition of carboxylic acids having acidic dissociation constants of $1 \times 10^{-6}$ or greater can help in dissolving the by-products. The addition of water can also help in dissolving the by-products, but such addition adversely impacts selectivity of the etch for oxides. In contrast, addition of carboxylic acids having high acidic dissociation constants (i.e., acidic dissociation constants of at least $1 \times 10^{-6}$) does not have such adverse impact on the etch selectivity.

The mechanism is provided herein to assist the reader in understanding aspects of the present invention, and is not to limit the claims except to the extent, if any, that such mechanism is expressly recited in the claims.

Figure 5:
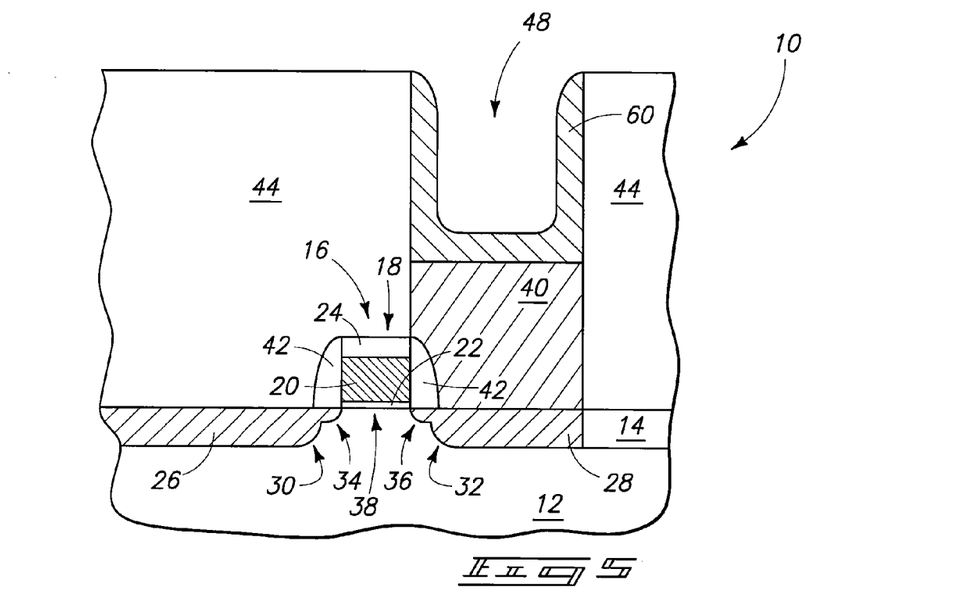
FIG. 5 is a view of the FIG. 1 construction shown at a processing stage subsequent to that of FIG. 3.

Referring next to FIG. 5, construction 10 is illustrated at a processing step subsequent to that of FIG. 3. Specifically, masking material 46 (FIG. 3) has been removed, and a first capacitor electrode 60 has been formed within opening 48. Capacitor electrode 60 can comprise any suitable composition or combination of compositions. In particular aspects, electrode 60 will comprise metal, metal compounds, and/or conductively-doped semiconductor material such as, for example, conductively-doped silicon. The electrode is shown formed only within opening 48. Such can be accomplished by providing the electrode material to extend over an uppermost surface of material 44 as well as within the opening, and subsequently subjecting construction 10 to planarization (such as, for example, chemical-mechanical polishing) to remove the conductive material from over material 44 while leaving the conductive material within the opening.

Figure 6:
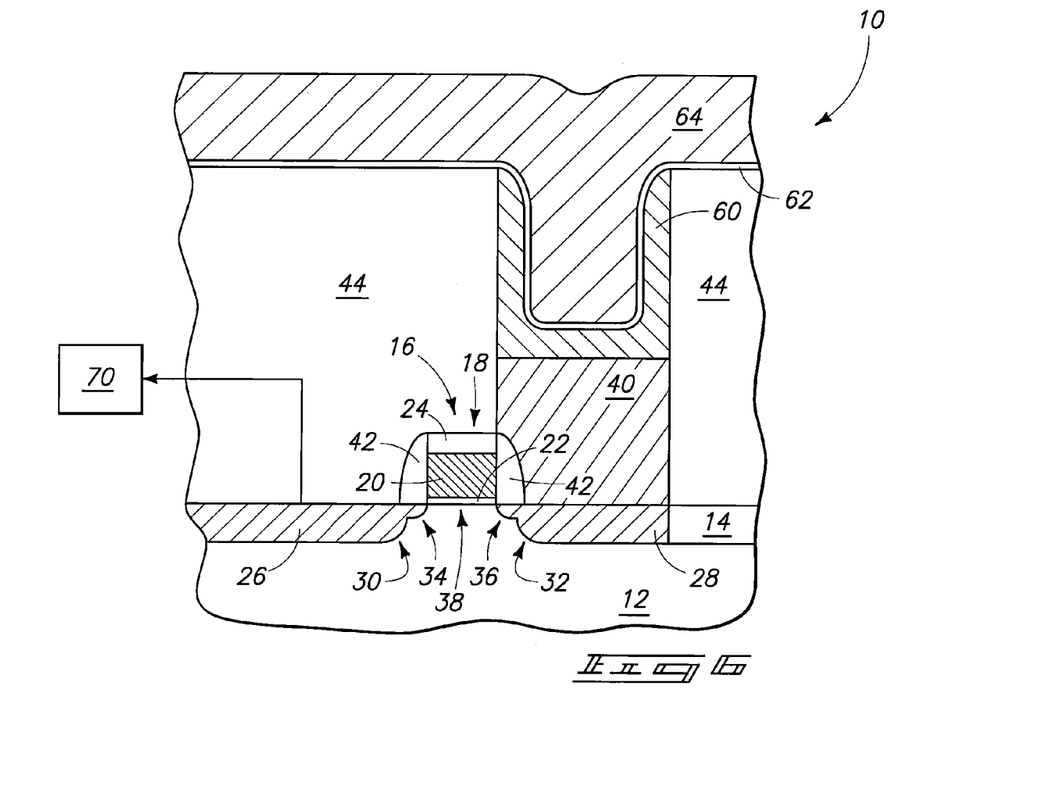
FIG. 6 is a view of the FIG. 1 construction shown at a processing stage subsequent to that of FIG. 5.

Referring next to FIG. 6, capacitor dielectric 62 is formed over first capacitor electrode 60, and a second capacitor electrode 64 is formed over the capacitor dielectric 62. Capacitor dielectric 62 can comprise any suitable composition or combination of compositions, and in particular aspects will comprise, consist essentially of, or consist of silicon dioxide, silicon nitride, aluminum oxide, and/or various high-k dielectric materials. The second capacitor electrode 64 can comprise any suitable composition or combination of compositions, and in particular aspects will comprise, consist essentially of, or consist of metal, metal compounds, and/or conductively-doped semiconductor material. The second capacitor electrode 64 is capacitively coupled with the first capacitor electrode 60. Accordingly, the construction comprising electrodes 60 and 64 together with dielectric material 62 is a capacitor construction. Such capacitor construction is electrically coupled with source/drain region 28 through conductive pedestal 40.

A bitline 70 is shown electrically coupled with source/drain region 26. Accordingly, the construction of FIG. 6 can be considered to be a DRAM unit cell configured to be incorporated within a memory array.

The shown aspect of the invention is but one of many applications for methodology of the present invention. For instance, the incorporation of one or more of carboxylic acids having an acidic dissociation constant of at least $1 \times 10^{-6}$ can be utilized during the initial etch to form an opening (such as, for example, the etch of FIG. 2), as well as, or alternatively to, utilization of the carboxylic acid during the cleaning step. Also, although the shown opening extends entirely through one or more oxide-containing compositions to a conductive node, it is to be understood that the invention encompasses aspects in which an opening is formed to extend only partially through one or more oxide-containing compositions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method comprising:
   providing an etched silicon-dioxide-containing surface having silicon-dioxide-containing debris thereon, the silicon-dioxide-containing surface and the silicon-dioxide-containing debris together possessing the property of exhibiting an amount of roughness on the silicon-dioxide-containing surface that is induced if the silicon-dioxide-containing debris is removed using a cleaning mixture containing an organic solvent and fluoride ions;
   providing a modified cleaning mixture containing the organic solvent, the fluoride ions, and further containing one or more components of a carboxylic acid having an aqueous acidic dissociation constant of at least $1 \times 10^{-6}$, the carboxylic acid comprising at least two carboxylic acid groups;
   removing at least some of the silicon-dioxide-containing debris from the silicon-dioxide-containing surface using the modified cleaning mixture, the inclusion of the one or more components of the carboxylic acid reducing the amount of roughness to a lesser amount of roughness induced during the removal of the silicon-dioxide-containing debris using the modified cleaning mixture.

2. The method of claim 1 wherein the cleaning mixture exhibits an etch selectivity for oxides and the modified cleaning mixture exhibits the same etch selectivity for oxides.

3. The method of claim 1 wherein the reduced amount of roughness is RMS roughness measured by atomic force microscopy.

4. The method of claim 1 wherein a total concentration of the one or more components of the carboxylic acid is from about 1 part per million to a solubility limit of the components in the mixture.

5. The method of claim 1 wherein the carboxylic acid is a di-carboxylic acid.

6. The method of claim 1 wherein the carboxylic acid comprises at least three carboxylic acid groups.

7. The method of claim 1 wherein the modified cleaning mixture further contains one or more components of at least one additional carboxylic acid having an aqueous acidic dissociation constant of at least $1 \times 10^{-6}$.

8. The method of claim 7 wherein the carboxylic acid is trichloroacetic acid and the additional carboxylic acid comprises at least two carboxylic acid groups.

9. The method of claim 1 wherein the mixture is a solution, and wherein the organic solvent consists of one or more members selected from the group consisting of alcohols, ketones, ethers, and esters.

10. The method of claim 1 wherein the mixture is a solution, and wherein the organic solvent consists of an alcohol present in the solution to a concentration of at least about 90%, by weight.

11. The method of claim 1 wherein the mixture is a solution, and wherein the organic solvent is isopropyl alcohol present in the solution to a concentration of at least about 90%, by weight.

12. The method of claim 1 wherein a total concentration of the one or more components of the carboxylic acid is from 1 part per million to a solubility limit of such carboxylic acid in the cleaning mixture, and the cleaning mixture and modified cleaning mixture contain a combination of:
   from about 90% to about 99.9%, by weight, isopropyl alcohol;
   from about 0.03% to about 0.3%, by weight, hydrofluoric acid;
   from about 0.02% to about 0.3%, by weight, ammonium fluoride; and
   water.

13. A semiconductor processing method comprising:
   providing an etched silicon-dioxide-containing surface having silicon-dioxide-containing debris thereon, the silicon-dioxide-containing surface and the silicon-dioxide-containing debris together possessing the property of exhibiting an amount of RMS roughness as measured by atomic force microscopy on the silicon-dioxide-containing surface that is induced if the silicon-dioxide-containing debris is removed using a cleaning mixture containing a combination of:
     from about 90% to about 99.9%, by weight, organic solvent;
     from about 0.03% to about 0.3%, by weight, hydrofluoric acid to provide fluoride ions in the mixture; and
     water;
   providing a modified cleaning mixture containing the combination of the organic solvent, the fluoride ions, the water, and further containing one or more components of trichloroacetic acid and one or more components of at least one additional carboxylic acid having an aqueous acidic dissociation constant of at least $1 \times 10^{-6}$, the additional carboxylic acid having at least two carboxylic acid groups;
   removing at least some of the silicon-dioxide-containing debris from the silicon-dioxide-containing surface using the modified cleaning mixture, the inclusion of trichloroacetic acid and the additional carboxylic acid reducing the amount of roughness to a lesser amount of RMS roughness induced during the removal of the silicon-dioxide-containing debris using the modified cleaning mixture.

14. The method of claim 13 wherein a total concentration of the trichloroacetic acid and the at least one additional carboxylic acid is from 1 part per million to a solubility limit of such acids in the cleaning mixture.

15. The method of claim 13 wherein the organic solvent is isopropyl alcohol.

16. A semiconductor processing method, comprising:
providing a semiconductor substrate having an oxide supported thereon, the oxide consisting essentially of silicon dioxide or doped silicon dioxide;
etching at least one opening which extends at least partially through the oxide, the etching leaving silicon-dioxide-containing debris within the opening; and
utilizing trichloroacetic acid in combination with at least one additional carboxylic acid having an aqueous acidic dissociation constant of at least $1 \times 10^{-6}$ during cleaning of at least some of the silicon-dioxide-containing debris from within the opening, the at least one additional carboxylic acid containing at least two carboxylic acid groups.

17. The method of claim 16 wherein, without the trichloroacetic acid and the at least one additional carboxylic acid, the cleaning induces an increased amount of roughness within the opening during removal of the silicon-dioxide-containing debris.

18. The method of claim 17 wherein the increased amount of roughness is RMS roughness measured by atomic force microscopy.

19. The method of claim 17 wherein a total concentration of the trichloroacetic acid and the at least one additional carboxylic acid is from 1 part per million to a solubility limit of such acids in a cleaning solution used during the cleaning and the cleaning solution further comprises:
from about 90% to about 99.9%, by weight, isopropyl alcohol;
from about 0.03% to about 0.3%, by weight, hydrofluoric acid;
from about 0.02% to about 0.3%, by weight, ammonium fluoride; and
water.

20. The method of claim 19 wherein the cleaning solution comprises from about 98% to about 99.9%, by weight, isopropyl alcohol.

* * * * *

UNITED STATES PATENT AND TRADEMARK OFFICE
CERTIFICATE OF CORRECTION

PATENT NO. : 8,124,545 B2
APPLICATION NO. : 12/778043
DATED : February 28, 2012
INVENTOR(S) : Niraj B. Rana et al.

Page 1 of 1

It is certified that error appears in the above-identified patent and that said Letters Patent is hereby corrected as shown below:

On the Title page, in field (56), under "Other Publications", in column 2, line 2, delete "PCT/US2006/016680, PC, Sep. 4, 2006, PCT Search Report." and insert the same on First Page, Col. 2, under "Other Publications", Line 3 as a new entry.

Signed and Sealed this
Eighth Day of May, 2012

David J. Kappos
*Director of the United States Patent and Trademark Office*